United States Patent
Wong et al.

(10) Patent No.: US 9,159,170 B2
(45) Date of Patent: Oct. 13, 2015

(54) SYSTEM AND METHOD FOR OPTIMAL GEOMETRY CONFIGURATION BASED ON PARTS EXCLUSION

(71) Applicant: NGRAIN (Canada) Corporation, Vancouver (CA)

(72) Inventors: Chun Yue Gordon Wong, Coquitlam (CA); Jacqueline Li, Delta (CA); Jeffrey York Brace, Coquitlam (CA); Graham Thurstan Smith, Saskatoon (CA)

(73) Assignee: NGRAIN (Canada) Corporation, Vancouver, BC (CA)

( * ) Notice: Subject to any disclaimer, the term of this patent is extended or adjusted under 35 U.S.C. 154(b) by 130 days.

(21) Appl. No.: 13/777,916

(22) Filed: Feb. 26, 2013

(65) Prior Publication Data

US 2014/0240315 A1  Aug. 28, 2014

(51) Int. Cl.
  *G06T 19/20* (2011.01)
  *G06F 17/50* (2006.01)
(52) U.S. Cl.
  CPC ............. *G06T 19/20* (2013.01); *G06F 17/5095* (2013.01); *G06T 2219/2008* (2013.01); *G06T 2219/2021* (2013.01)
(58) Field of Classification Search
  CPC . G06T 15/40; G06T 19/20; G06T 2219/2008; G06T 2219/2021; G06F 17/5095
  See application file for complete search history.

(56) References Cited

U.S. PATENT DOCUMENTS

| | | | |
|---|---|---|---|
| 6,341,361 B1 * | 1/2002 | Basto et al. | 714/726 |
| 6,538,654 B1 * | 3/2003 | Rose et al. | 345/473 |
| 6,867,774 B1 | 3/2005 | Halmshaw et al. | |
| 7,050,054 B2 | 5/2006 | Halmshaw | |
| 7,218,323 B1 | 5/2007 | Halmshaw et al. | |
| 7,317,456 B1 | 1/2008 | Lee | |
| 7,420,555 B1 | 9/2008 | Lee | |
| 7,965,290 B1 | 6/2011 | Kouznetsov et al. | |
| 8,217,939 B1 | 7/2012 | Bonciu et al. | |
| 2010/0231588 A1 * | 9/2010 | Barczak | 345/422 |

FOREIGN PATENT DOCUMENTS

| | | |
|---|---|---|
| WO | 0207088 A2 | 1/2002 |
| WO | 0207089 A2 | 1/2002 |

OTHER PUBLICATIONS

Woo et al., "Myths and truths of Interactive Volume Graphics," Interservice/Industry Training, Simulation, and Education Conference (I/ITSEC) Paper No. 1755, 2004, pp. 1-10.

* cited by examiner

Primary Examiner — Xiao Wu
Assistant Examiner — Chong Wu
(74) Attorney, Agent, or Firm — Seed IP Law Group PLLC

(57) ABSTRACT

System and method are provided for building and rendering a 3D graphics dataset of an object that consists of multiple parts, wherein the 3D graphics dataset includes a 3D geometry dataset and a configuration file, and in the configuration file each of the multiple parts is identified as used (e.g., visible, actionable) or unused (e.g., not visible, not actionable) in each of multiple display features (e.g., in display states, such as in animations, or in display relationships). The method determines which of the multiple parts are unused in each of the multiple display features and identifies those parts, which are unused in all of the display features, as excluded parts, and saves a list of the identified excluded parts in association with the object. In rendering the object on a display, the method does not load data directed to the excluded parts, to thereby speed up the loading/rendering process.

18 Claims, 6 Drawing Sheets

SYSTEM AND METHOD FOR OPTIMAL GEOMETRY CONFIGURATION BASED ON PARTS EXCLUSION

BACKGROUND

1. Technical Field

The present invention relates generally to processing a 3D graphics dataset, and more specifically to optimally configuring a 3D graphics dataset representative of a 3D object consisting of multiple parts, based on exclusion of some of the parts.

2. Description of the Related Art

Three-dimensional ("3D") digital data may be produced by a variety of devices that involve three-dimensional scanning, sampling and/or numerical modeling. For example, computed tomography (CT) and magnetic resonance imaging (MRI) devices scan portions of a human body and generate image slices of the body, which when combined or stacked, generate a 3D representation of the body including its surface and internal volume.

Various 3D geometry representations are available. For example, volume graphics represent a promising way to achieve the degree of realism required for high quality 3D simulations and visualization applications because volume models can contain all the surface and internal characteristics of a real object. This is in contrast to, for example, polygon-based graphics, which contain only the information about the surfaces of a 3D object. In the case of volume graphics, volume elements (i.e., "voxels") are the base data used to represent 3D objects. Typically, voxels are simply pixels that have a third coordinate z in addition to x and y coordinates in a Cartesian coordinate system (though voxels may take various other forms, also). In other words, voxels are equally sized cubes that form a discretely defined 3D space. A typical voxel-based 3D scene can consist of one or more "voxel sets," each of which in turn consists of one or more voxels. For example, the 3D scene may include one or more sets of MRI slices, each forming a voxel set, which in turn includes a plurality of voxels within each voxel set.

3D voxel data are rendered to produce a 2D image on a suitable output device, such as a video display or a printer. As used herein, the term "render" means to produce a 2D graphics image on an output device (e.g., a display screen) from a 3D graphics data file, and typically involves creating an image using color, texture, etc., to give the image a realistic look. In typical applications of voxel-based technologies, only one voxel set is rendered. For example, in medical MRI applications, a single voxel set representing a single MRI slice may be rendered at a time.

In other applications, such as in rendering voxel data produced using software available from NGRAIN (Canada) Corp. of Vancouver B.C., Canada, it is often necessary to render (sometimes a large number of) multiple voxel sets at a time. Briefly, NGRAIN® technology permits 3D modeling of an object, wherein each of multiple parts or layers forming the object is represented as a voxel set each consisting of one or more voxels. According to NGRAIN® technology, it is possible to render a large number of voxel sets representing multiple parts or layers together, while allowing a user to manipulate each part or layer separately in 3D space. For example, the user may break up the parts or layers to display an exploded view of an object, or to peel off an outer layer of the object to reveal its inner layer. Various details of NGRAIN® technology are described in commonly owned Patent Cooperation Treaty Publication No. WO 02/07088 A2 entitled "LIGHTING ADJUSTMENT METHODS AND APPARATUS FOR VOXEL DATA," commonly owned Patent Cooperation Treaty Publication No. WO 02/07089 A2 entitled "APPARATUS AND METHOD FOR ASSOCIATING VOXEL INFORMATION WITH DISPLAY POSITIONS," commonly owned U.S. Pat. No. 6,867,774 B1 entitled "METHOD AND APPARATUS FOR TRANSFORMING POLYGON DATA TO VOXEL DATA FOR GENERAL PURPOSE APPLICATIONS," commonly owned U.S. Pat. No. 7,050,054 B2 entitled "METHOD, APPARATUS, SIGNALS AND CODES FOR ESTABLISHING AND USING A DATA STRUCTURE FOR STORING VOXEL INFORMATION," commonly owned U.S. Pat. No. 7,218,323 B1 entitled "METHOD AND SYSTEM FOR RENDERING VOXEL DATA WHILE ADDRESSING MULTIPLE VOXEL SET INTERPENETRATION," commonly owned U.S. Pat. No. 7,317,456 B1 entitled "METHOD AND APPARATUS FOR TRANSFORMING POINT CLOUD DATA TO VOLUMETRIC DATA," commonly owned U.S. Pat. No. 7,420,555 B1 entitled "METHOD AND APPARATUS FOR TRANSFORMING POINT CLOUD DATA TO VOLUMETRIC DATA," commonly owned U.S. Pat. No. 7,965,290 B1 entitled "METHOD, SYSTEM, AND DATA STRUCTURE FOR PROGRESSIVE LOADING AND PROCESSING OF A 3D DATASET," and commonly owned U.S. Pat. No. 8,217,939 B1 entitled "METHOD AND SYSTEM FOR CALCULATING VISUALLY IMPROVED EDGE VOXEL NORMALS WHEN CONVERTING POLYGON DATA TO VOXEL DATA," which are all specifically incorporated herein by reference. Additional details of NGRAIN® technology can also be found in an article entitled "Myths and Truths of Interactive Volume Graphics" published in I/ITSEC 2004 Conference.

BRIEF SUMMARY

In various 3D geometry representations, such as a voxel-based, polygon-based, or spline-based geometry, an object consisting of multiple parts can be represented with each part being separately modeled. For example, FIG. 1A illustrates an object 1 in the form of an airplane, which consists of eight parts (1 fuselage (1), 2 wings (2)(3), 2 engines (4)(5), 1 vertical stabilizer (6), and 2 horizontal stabilizers (7)(8)). In the illustrated example, voxel-based modeling is used and each part is represented by a voxel set including multiple voxels. For example, FIG. 1B shows a voxel set 2 that represents a horizontal stabilizer (7) of FIG. 1A, including multiple voxels arranged in an x-y-z Cartesian coordinate system. Each voxel within the voxel set 2 is defined by its geometric location (x, y, z) in the Cartesian coordinate system, and may be an occupied voxel 3 or an empty voxel 4 that are occupied or not occupied, respectively, by the horizontal stabilizer (7).

Regardless of what type of 3D geometry representation is employed, with use of multiple parts to render an object, there remains a continuous need to more efficiently use computational resources to thereby speed up the loading and rendering process. The present invention according to its one aspect is directed to addressing this continuous need.

According to various embodiments of the present invention, a system and a method are provided for building and rendering a 3D graphics dataset of an object that consists of multiple parts, wherein the 3D graphics dataset includes a 3D geometry dataset and a configuration file for the object. In the configuration file each of the multiple parts is identified as used (e.g., visible, actionable) or unused (e.g., not visible, not actionable) in each of multiple display features. A display feature means, for example, a display state in which an object is rendered on the display (e.g., in animations, in slides, in snapshots, etc.). A display feature may also mean a display relationship, according to which multiple parts of an object are rendered on the display, e.g., how two parts of an object are rendered in a constrained relationship to each other. The system and method automatically determine which of the multiple parts of an object are unused (e.g., not visible) in each of the multiple display features, and identify those parts that are unused in all of the display features as excluded parts. The system and method then save a list of the excluded parts. During file loading, in reference to the list of the excluded parts, a processor does not even load data directed to those excluded parts. Thus, only data directed to parts that are used in at least one of the display features are loaded and processed further, so as to make efficient use of computational resources (e.g., memory space) and to speed up the loading/rendering process.

According to one aspect of the invention, use of a list of excluded parts allows for building a single 3D graphics dataset to represent multiple objects sharing some common parts. For example, if there are three types of airplanes that share the same overall structure except that each type is equipped with a different engine, one 3D dataset may be created that includes one common 3D geometry dataset, three unique 3D geometry datasets, and three lists of excluded parts respectively created for the three types of airplanes. Each one of the three lists of excluded parts identifies the parts that uniquely belong to the other two types of airplanes as excluded parts. Since the 3D dataset has only one common 3D geometry dataset for the common part(s), maintaining and updating the common 3D geometry dataset needs to be done only once in the 3D dataset as opposed to having to repeat the maintenance and updating three times in three separate 3D datasets created for the three types of airplanes, respectively. Also, use of the list of excluded parts for each type of objects sharing common parts as represented in a single 3D dataset allows for easy addition of further types of objects that also share the same common parts to the 3D dataset. That is, 3D modeling of the common parts has been completed in the 3D dataset and thus can be reused when adding further types of objects to the 3D dataset.

In addition, as before, rendering each type of airplane on a display does not entail loading of data that uniquely belong to the other two or more types of airplanes (i.e., data directed to the "excluded parts"), and thus the loading/rendering speed is improved and efficient use of computational resources (e.g., memory space) is achieved. Still further, the list of excluded parts may be used in the context of downloading also, such that when an object is downloaded its excluded parts are not downloaded to thereby speed up the download time.

DETAILED DESCRIPTION

Figure 1A:
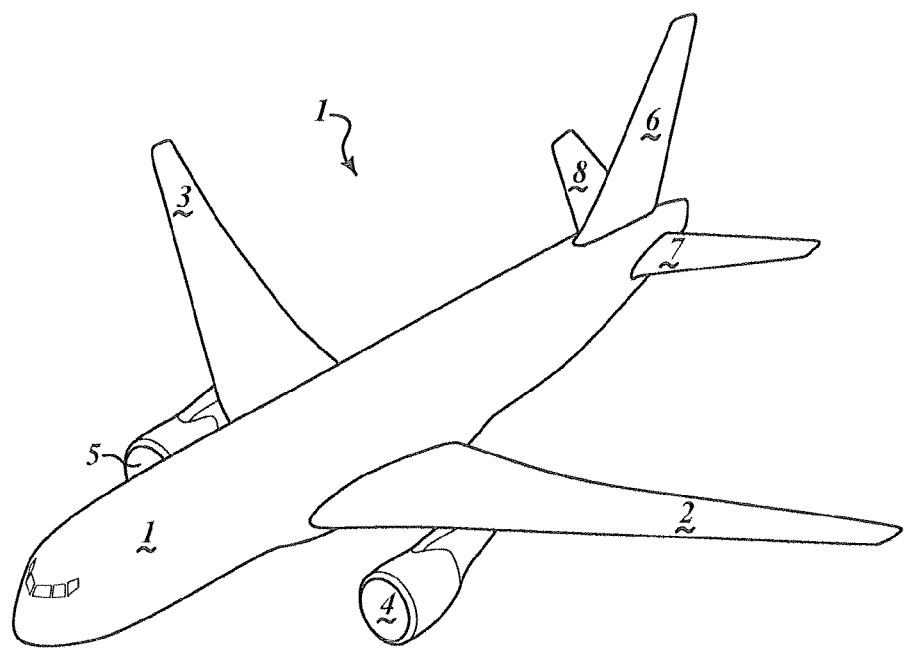
FIG. 1A is a schematic view of an object (an airplane in this example) consisting of eight parts.
Figure 1B:
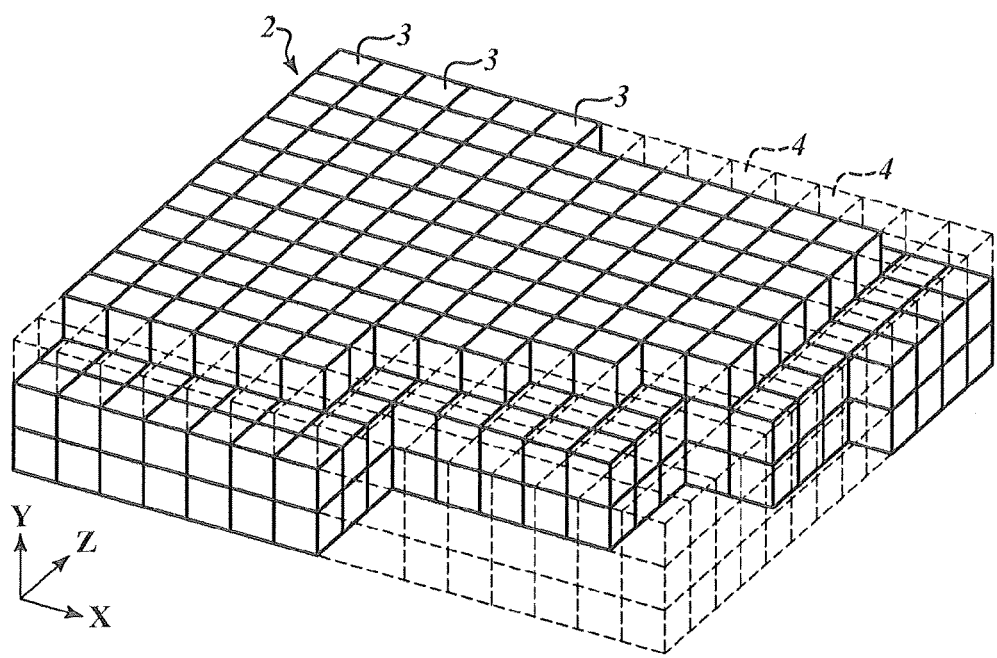
FIG. 1B is a schematic view of a voxel set representing a horizontal stabilizer part of the airplane object of FIG. 1A, according to one implementation example of the present invention.
Figure 2A:
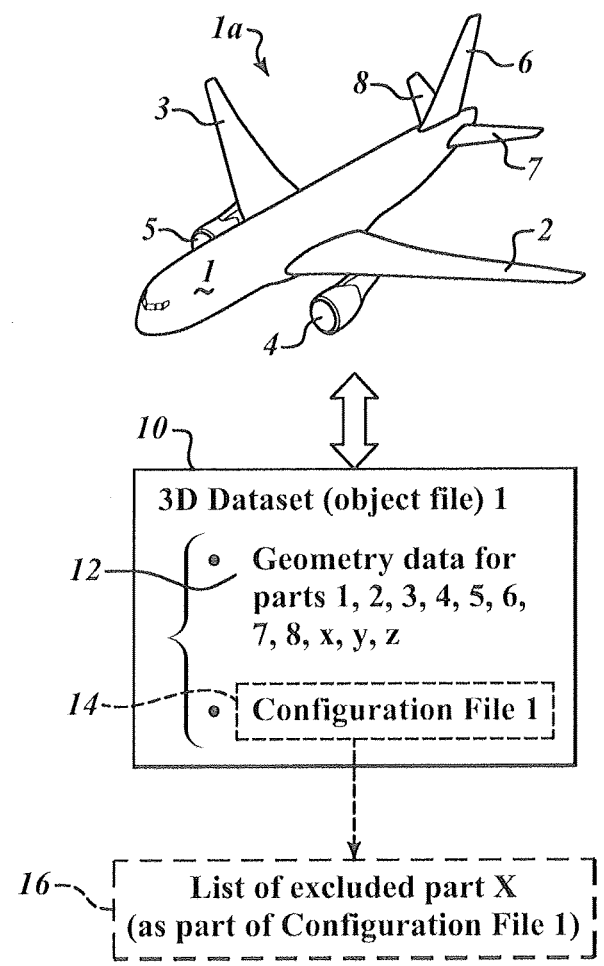
FIG. 2A is a schematic diagram illustrating automatic generation of a list of excluded parts, which identifies parts that are unused (e.g., not visible) in all display features as excluded parts, which will not be loaded and rendered on a display screen.

FIG. 2A is a schematic diagram illustrating automatic generation of a list of excluded parts, which may be saved as part of or in connection with a configuration file (e.g., an XML file) that defines how to process a 3D dataset such as how to load/render a 3D object on a display. Briefly, a list of excluded parts identifies those parts that are unused (e.g. not visible) in all display features (e.g., display states, display relationships) as excluded parts, which will not be loaded and rendered on a display screen. In the following description, a 3D volume graphics object represented by voxel sets is used as one example of a 3D object including some parts to be excluded. However, the system and method for optimally configuring a 3D dataset based on parts exclusion according to various embodiments of the present invention may be equally applied to other types of 3D objects, such as polygon-based and spline-based 3D objects. Thus, the present invention is by no means limited to application to a 3D volume graphics object.

In the illustrated embodiment of FIG. 2A, assume that a first type of airplane 1a is represented in a "3D dataset (or a 3D object file) 1" 10. In the illustrated example, the 3D object is represented by a 3D geometry dataset 12 based on volume graphics, and thus the 3D geometry dataset 12 defines the geometric locations of voxels in each voxel set (i.e., for each part) arranged in 3D space (e.g., x-y-z Cartesian coordinate). The 3D dataset 1 also includes a configuration file 14, which defines how to process the 3D geometry dataset 12, such as in what order various parts are to be loaded and rendered, which parts are detachable and not-detachable, how each part is to be rendered such as their attributes (e.g., shade information including color and alpha values, normal vector, texture, part/layer number).

The first type of airplane 1a includes eight parts—1 fuselage (1), 2 wings (2)(3), 2 engines (4)(5), 1 vertical stabilizer (6), and 2 horizontal stabilizers (7)(8)—which are all used (e.g., visible) in a display feature (e.g., in a display state) in which the airplane 1a is displayed in FIG. 2A. Assume that the first type of airplane 1a also includes other parts that are not used (e.g., not visible) in the display feature as shown in FIG. 2A. For example, the first type of airplane 1a may include parts (x), (y) and (z) that are internal to the airplane 1a or are behind other parts and thus are not used (e.g., not visible). Since these parts (x), (y) and (z) form part of the first type of airplane 1a despite that they may not be used in a particular display feature, the geometry dataset 12 of the 3D object 1 includes geometry data for those parts (x), (y) and (z), also. That is, in the illustrated example, the 3D geometry dataset 12 includes geometry data for parts 1, 2, 3, 4, 5, 6, 7, 8, x, y and z.

According to various embodiments, a configuration file includes multiple display features each defining how to render a 3D geometry dataset on a display. For example, display features may include a display state and a display relationship. A display state means a state (or form) in which an object is rendered on a display, such as animations, slides, and snapshots. A display relationship means a defined relationship, according to which multiple parts of an object are rendered on a screen. For example, a "constraints" feature is one type of display relationship, according to which multiple parts of an object are rendered in a constrained relationship relative to each other, such as how the movement and appearance of an airplane's two horizontal stabilizers are constrained relative to each other when rendered. How a 3D object is rendered on a display may be defined in these various types of display features (e.g., display states and display relationships) as included in a configuration file.

In each of the multiple display features (e.g., an animations feature, a constraints feature, etc), each part of a 3D object is specified as either unused (e.g., not visible, not actionable) or used (e.g., visible or actionable). A part is visible when it is visible to a user on a display in a particular display feature. A part is actionable when, for example, it can be selected by a user for further action such as movement, resizing, rotation, coloring, etc., on a display, in a particular display feature. Typically, whether each part is used or not in each display feature is specified by a user (operator) when the display feature is defined. For example, in an "animations" feature, parts that are not visible in any of key frames forming the animation may be defined as unused while all other parts may be defined as used, when the animation is created. The definition of which parts are unused and which parts are not may be made manually by the user (operator), or semi-automatically or automatically according to any suitable image analysis technique. As another example, in a "constraints" feature, all used (e.g., visible) parts plus any parts whose movement are constrained by the movement of any of the used parts may be designated as used.

Still referring to FIG. 2A, for example, assume that the configuration file 14 of the first type of airplane 1a includes five display features, each defining how the airplane 1a is to be rendered on a display. Assume further that a user may have specified part x as unused in all of the five display features, while specifying parts y and z as unused in only the "animations" feature. That is, assume in this example that parts y and z, specified as unused in "animations" are specified as used in all of the other four display features besides "animations," as shown below:

TABLE 1

| Display Feature | Unused Part(s) |
|---|---|
| "animations" | Parts (x), (y), (z) |
| "constraints" | Part (x) |

TABLE 1-continued

| Display Feature | Unused Part(s) |
|---|---|
| display feature (i) | Part (x) |
| display feature (ii) | Part (x) |
| display feature (iii) | Part (x) |

Figure 3A:
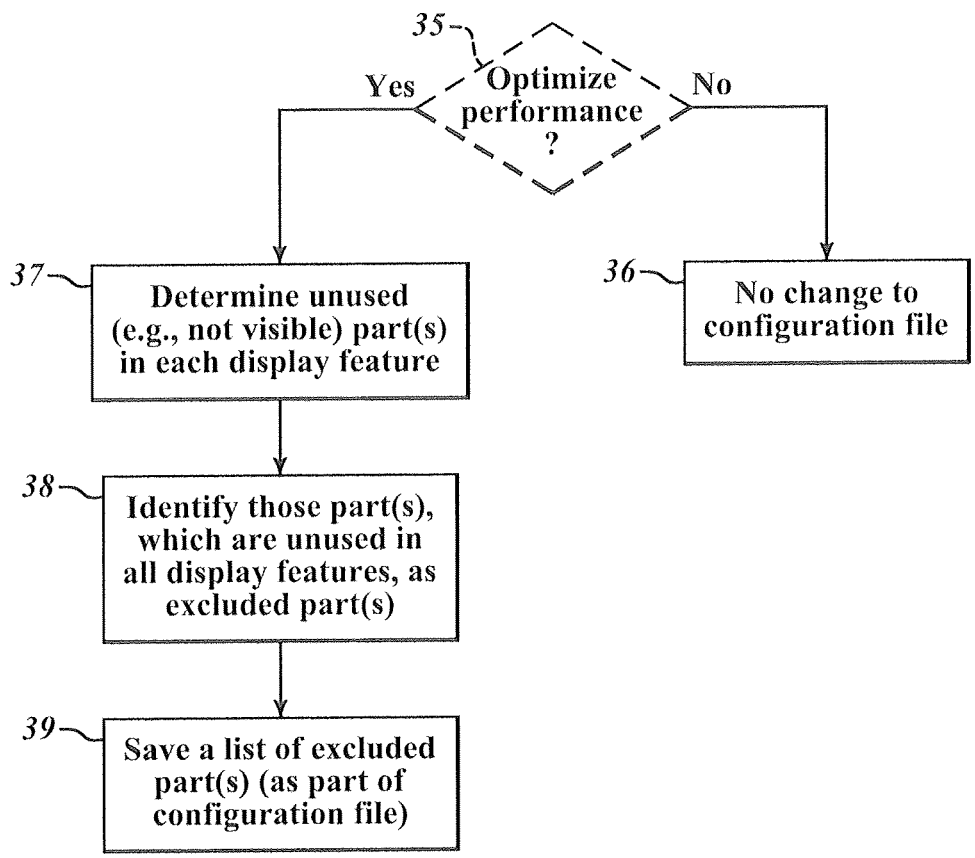
FIG. 3A is a flow chart illustrating an algorithm for automatically generating a list of excluded parts, which identifies parts that are unused (e.g., not visible) in all display features as excluded parts, the algorithm being configured to be executed by a processor capable of 3D graphics processing, according to one embodiment of the present invention.

According to various embodiments of the present invention, a system and a method are provided for automatically generating a list of excluded parts, which identifies parts that are unused in all of the display features for an object as excluded parts, i.e., parts that are excluded from being loaded. FIG. 3A is a flow chart illustrating an algorithm for automatically generating a list of excluded parts, which may then be saved as part of or in association with a configuration file of a object according to one embodiment of the present invention.

In block 35, first, a user may select whether to optimize performance in 3D graphics loading/rendering to thereby achieve efficient use of computational resources such as memory space. To this end, for example, any suitable prompt may be presented on a display screen of a computer device, to be described below in reference to FIG. 5. User selection of optimizing performance may be indicated, for example, by the user selecting a designated icon (e.g., "Optimize Performance?" icon) on the display. If the user does not choose to optimize performance, in block 36, no change is made to the current configuration file. For example in FIG. 2A, in this case, no change is made to the "Configuration File 1" 14 in the 3D dataset 10 for the first type of airplane 1a.

On the other hand, if the user chooses to optimize performance, in block 37, the algorithm scans through each of the display features included in a configuration file to identify parts that are unused in each display feature. For example, the algorithm identifies the parts that are "unused" in each of five display features, as summarized in Table 1 above.

Though the illustrated embodiment includes the decision block 35 to determine whether or not to optimize performance, in various other embodiments of the invention, the algorithm may proceed directly to block 37 to always determine parts that are unused in each display feature. Next, in block 38, the algorithm identifies those parts that are unused in all of the display features as parts to be excluded, i.e., those excluded parts that are to be not even loaded in connection with a loading/rendering process. In the present example of Table 1 above, part x is thus identified as an excluded part. Parts y and z, on the other hand, are not excluded parts because they are unused only in the "animations" feature and are used in all of the other display features. In various embodiments of the present invention, only those parts that are unused in all display features are automatically designated as "excluded parts," so as to ensure proper rendering of each of the parts that is used in at least one display feature. In some embodiments, a user may select a subset of all display features as the display features for use in block 38. For example, in the present example, the user may select only the first four display features for use in optimizing performance, while leaving out the "display feature (iii)". Then, in block 37, the algorithm scans through each of the first four display features to identify unused parts in each display feature and, in block 38, the algorithm identifies those parts that are unused in all of the first four display features as parts to be excluded. In short, in this example, whether a part is unused or not in the "display feature (iii)" is ignored in blocks 37 and 38. Thus, in the present application, "all" as used in identifying parts that are unused in "all" display features means all display features that are determined to be used for optimizing performance, according to various embodiments of the present invention.

In block 39, the list of excluded parts is saved for the object, in a specified storage space in a memory. In various embodiments of the present invention, the list of excluded parts is saved as part of, or in connection with, the configuration file for the object. At this time, essentially, the configuration file is modified, to the extent that it includes or is associated with the excluded parts list. Referring to FIG. 2A, the modification of a configuration file is illustrated by a transformation of the "Configuration File 1" 14 into the "List of excluded part x (as part of Configuration File 1)" 16. In various other embodiments of the present invention, on the other hand, the list of excluded parts may be saved in association with the object but independently of a configuration file.

Figure 3B:
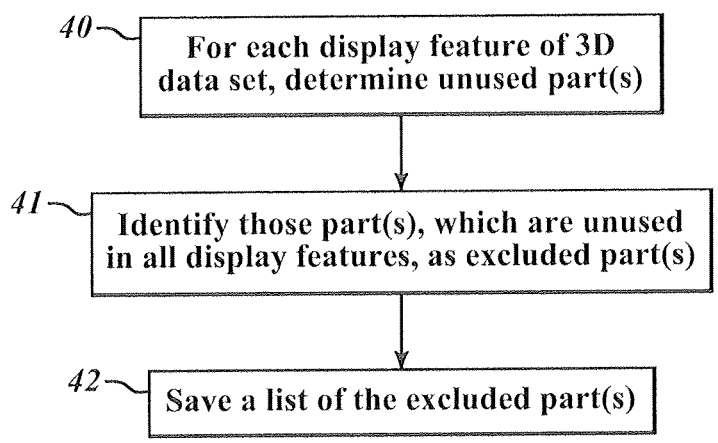
FIG. 3B is a flow chart illustrating a general form of an algorithm for automatically generating a list of excluded parts, which identifies parts that are unused (e.g., not visible) in all display features as excluded parts, according to one embodiment of the present invention.

FIG. 3B is a flowchart illustrating a general form of an algorithm for automatically generating an excluded parts list, which identifies parts that are unused (e.g., not visible) in all display features as excluded parts. In block 40, for each display feature of a 3D dataset (e.g., for each display state or relationship), unused parts are determined. In block 41, those parts that are unused in all of the display features are identified as excluded parts. In block 42, a list of the excluded parts as identified in block 41 is saved for the object, in connection with or independently of a configuration file for the object.

Figure 4A:
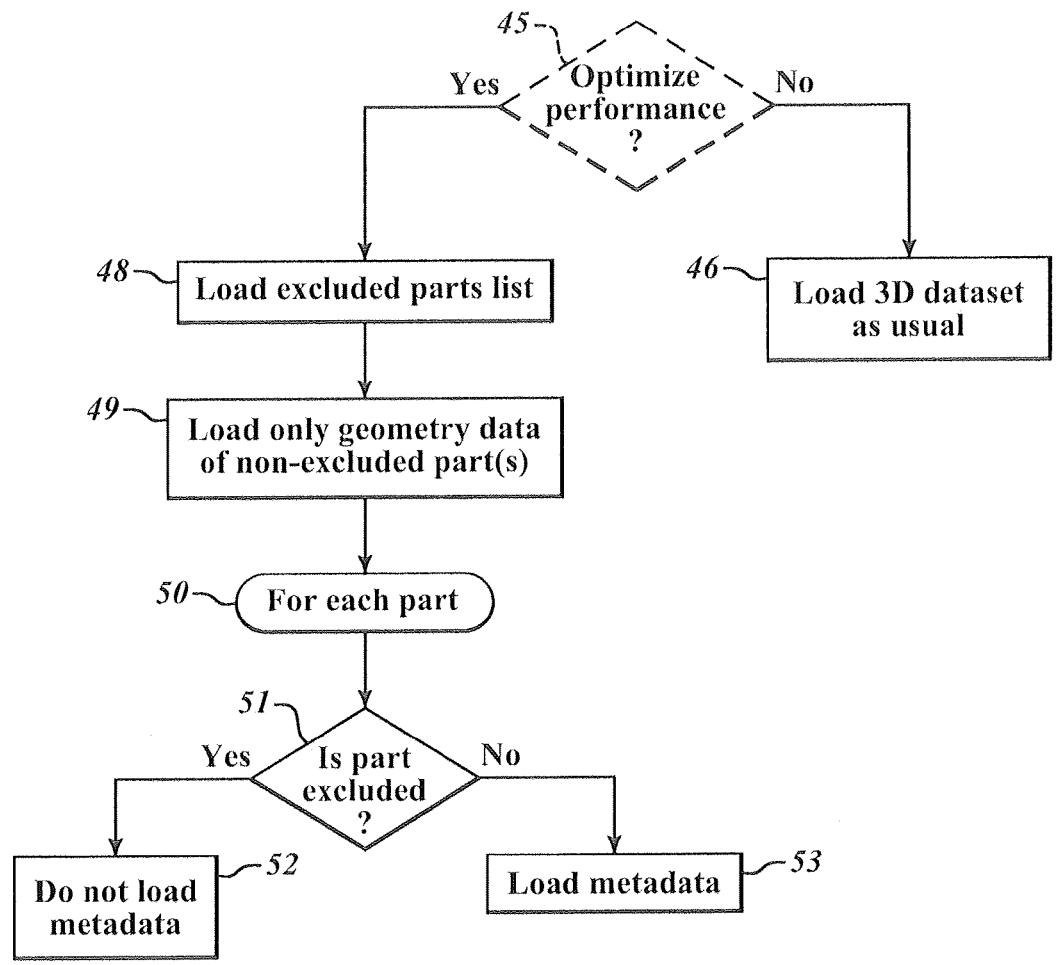
FIG. 4A is a flow chart illustrating an algorithm for loading and rendering a 3D object, without loading and rendering data directed to excluded parts of the object in reference to a list of excluded parts, according to one embodiment of the present invention.
Figure 4B:
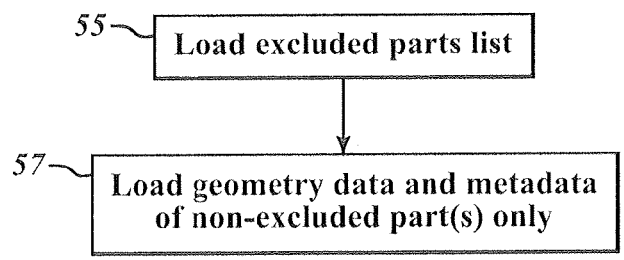
FIG. 4B is a flow chart illustrating a general form of an algorithm for not loading and rendering data directed to excluded parts of a 3D object in reference to a list of excluded parts, according to one embodiment of the present invention.

Next, referring to FIGS. 4A and 4B, a method and algorithm for loading and rendering a 3D dataset are described which, in reference to a list of excluded parts that has been saved, do not even load data directed to the excluded parts identified in the list. That is, only data directed to non-excluded parts are loaded and rendered. As used herein and as apparent to those skilled in the art, "loading" data means loading data from a specified storage space to a temporary storage space that is more readily accessible by a processor, such as moving data from ROM to RAM/cache. Thus, the method and algorithm, through selective loading of only the data directed to the non-excluded parts that are actually "used" in at least one of the display features, can speed up the loading/rendering process of a 3D object while saving precious computational resources such as memory space.

In block 45, optionally, a user may select whether to optimize performance of 3D graphics loading/rendering by, for example, selecting a designated icon (e.g., "Optimize Performance?" icon) on the display. If the user does not choose to optimize performance, in block 46, the 3D dataset is loaded for rendering in a conventional manner. That is, the entire geometry dataset of an object is loaded, though some parts of the object may be hidden (made not visible) on a display. On the other hand, if the user chooses to optimize performance, in block 48, the algorithm loads an excluded parts list, which has been saved for the object to be rendered. Also, in various other embodiments of the present invention, the decision block 45 is omitted and the algorithm starts at block 48 to load the list of excluded parts.

In block 49, in reference to the loaded list of excluded parts, the algorithm loads only the 3D geometry data of non-excluded parts. That is, 3D geometry data of the excluded parts identified in the list of excluded parts is not even loaded at this time. Referring additionally to FIG. 2A, for example, with respect to the first type of airplane 1a, the algorithm loads the 3D geometry data for parts 1, 2, 3, 4, 5, 6, 7, 8, y and z but does not load the 3D geometry data for the excluded part x.

Then, for each of the parts of the 3D dataset (block 50 in FIG. 4A), in block 51, it is determined whether the part is an excluded part as included in the list of excluded parts. If the part is an excluded part, in block 52, metadata associated with the part is not loaded. That is, for any excluded part, not only is its 3D geometry data not loaded (block 49), but also its metadata is not loaded (block 52), according to the illustrated embodiment. On the other hand, if the part is not an excluded part, then in block 53, metadata defining how to process and render the non-excluded part is loaded. For example, metadata related to rendering the non-excluded part of a 3D object in "animations" or in "constraints" display features, as described above, may be loaded. Various other types of metadata related to how to render a non-excluded part may include, for example, annotated notations or callouts associated with the non-excluded part, or attributes (color, shading, normals, etc.) of the non-excluded part. After the metadata is loaded in block 53, loading/rendering processing of the non-excluded part on a display may be performed using the 3D geometry data of the non-excluded part, as loaded in block 49, and the metadata for the non-excluded part, as loaded in block 53.

FIG. 4B is a flowchart illustrating a general form of an algorithm for loading and rendering a 3D graphics object in reference to an excluded parts list, which may have been saved as part of or in connection with a configuration file. In block 55, the excluded parts list, which is created pursuant to the flowcharts of FIGS. 3A and 3B for example, is loaded. In block 57, in reference to the excluded parts list, the algorithm loads only the 3D geometry data and metadata for non-excluded parts, while not even loading the 3D geometry data and metadata for the excluded parts in this embodiment. In some embodiments, on the other hand, only the geometry data of the excluded parts is not loaded while metadata for the excluded parts is loaded. These embodiments may be adopted, for example, when the size of metadata is not very large and resources saving (e.g., memory saving) achieved by not loading metadata is not significant.

According to various embodiments of the present invention, 3D geometry data and metadata for any parts of a 3D object, which are excluded (i.e., unused in all display features), are not even loaded (e.g., to a memory associated with the display for the purpose of rendering) in connection with a rendering process of the 3D object. Thus, only data directed to non-excluded parts are loaded and processed further, so as to make efficient use of limited computational resources (e.g., memory space) and to speed up the loading and rendering process.

Figure 2B:
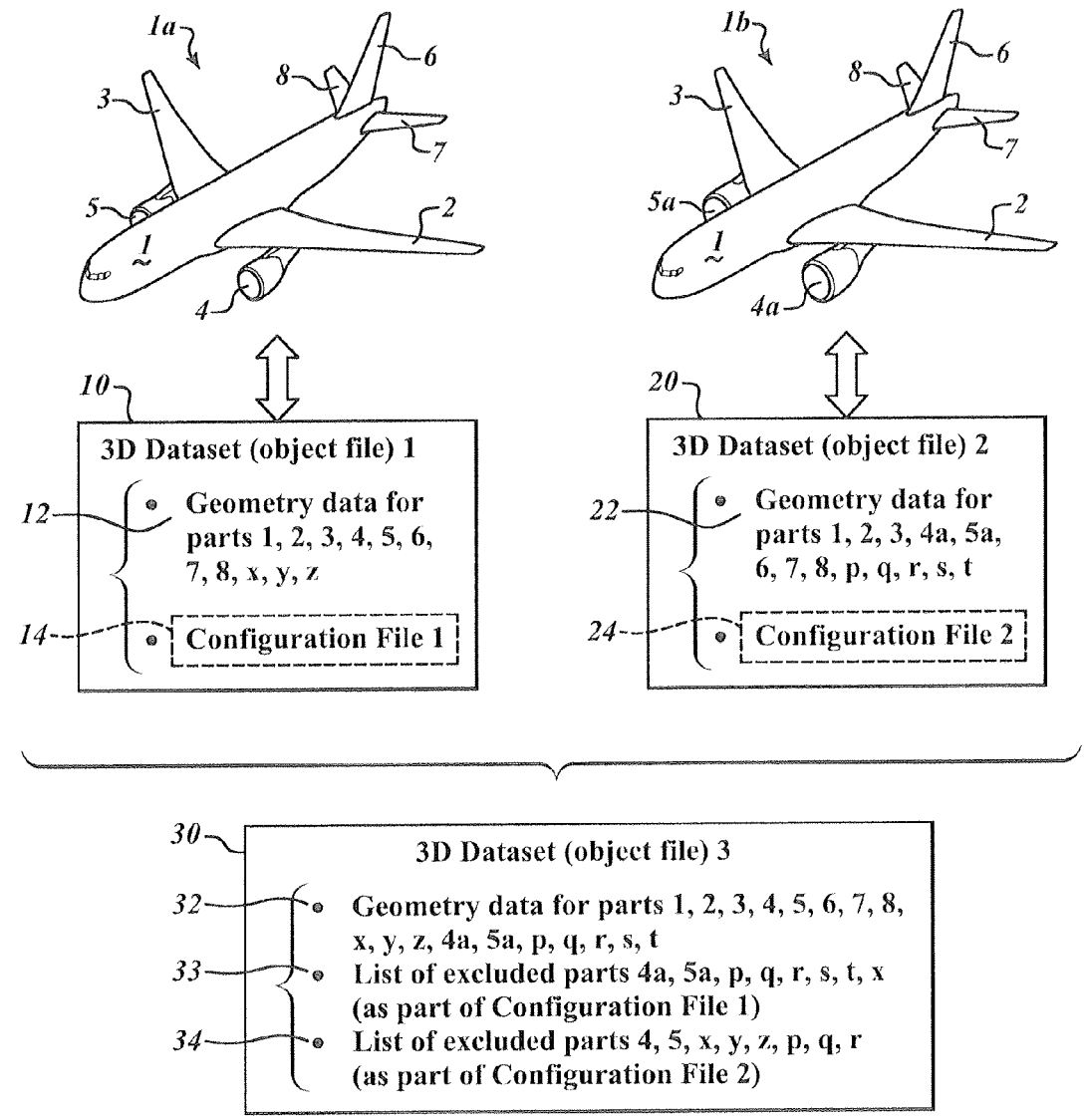
FIG. 2B is a schematic diagram illustrating automatic generation of two lists of excluded parts for two types of objects sharing common part(s) as represented in a single 3D graphics dataset.

Referring to FIG. 2B, according to one application of the present invention, multiple 3D objects can be represented in a single 3D dataset, which advantageously allows for easy sharing of common part(s) amongst the multiple 3D objects. In the illustrated example of FIG. 2B, assume that two types of airplanes, 1a and 1b, are respectively represented in 3D datasets (or 3D object files) 1 and 2 according to a conventional method. The first type of airplane 1a in FIG. 2B is the same as that described above in FIG. 2A. The second type of airplane 1b shares the same overall structure as the first type of airplane 1a, and shares the common parts 1, 2, 3, 6, 7 and 8 with the first type of airplane 1a. The first type of airplane 1a has parts that are unique to it, including its engine parts 4 and 5 and parts x, y and z that are unused (e.g., not visible) in the particular display feature of FIG. 2B. The second type of airplane 1b has parts that are unique to it, including its engine parts 4a and 5a and parts p, q, r, s and t that are unused (e.g., not visible) in the particular display feature of FIG. 2B. As before, though parts x, y and z are unused in this particular display feature, they nonetheless form part of the geometry dataset for the first type of airplane 1a and, thus, the geometry dataset 12 of the first type of airplane 1a includes geometry data for parts 1, 2, 3, 4, 5, 6, 7, 8, x, y, z. Similarly, the geometry dataset 22 of the second type of airplane 1b includes geometry data for parts 1, 2, 3, 4a, 5a, 6, 7, 8, p, q, r, s, t. The 3D dataset 10 for the first type of airplane 1a may also include a configuration file 14, and the 3D dataset 20 for the second type of airplane 1b may also include a configuration file 24, as shown in FIG. 2B.

Comparison of the 3D dataset 10 for the first type of airplane 1a and the 3D dataset 20 for the second type of airplane 1b shows that the geometry data for the common parts 1, 2, 3, 6, 7 and 8 is redundant between the two datasets.

Thus, according to one application of the present invention, the two types of airplanes 1a and 1b are represented in a single 3D dataset including two lists of excluded parts respectively generated for the two types of airplanes 1a and 1b, as shown in the 3D dataset 30 of FIG. 2B.

As illustrated, the 3D dataset 30 representative of both the first and second types of airplanes 1a and 1b includes a geometry dataset 32, which includes geometry data for the common parts 1, 2, 3, 6, 7, 8; geometry data for parts unique to the first type of airplane 4, 5, x, y, z; and geometry data for parts unique to the second type of airplane 4a, 5a, p, q, r, s, t.

The 3D dataset 30 also includes a list of excluded parts 33 for the first type of airplane 1a and another list of excluded parts 34 for the second type of airplane 1b. These lists of excluded parts are generated according to the method and algorithm according to various embodiments of the present invention as described above in reference to FIGS. 3A and 3B. Specifically, to build the list of excluded parts for the first type of airplane 1a, in block 37 of FIG. 3A (or block 40 of FIG. 3B), the algorithm determines that the following parts are unused in each of five display features defined for the first type of airplane 1a:

TABLE 2

| Display Feature | Unused Part(s) |
| --- | --- |
| "animations" | Parts (4a), (5a), (p-t), (x), (y), (z) |
| "constraints" | Parts (4a), (5a), (p-t), (x) |
| display feature (i) | Parts (4a), (5a), (p-t), (x) |
| display feature (ii) | Parts (4a), (5a), (p-t), (x) |
| display feature (iii) | Parts (4a), (5a), (p-t), (x) |

Note that the parts unique to the other (second) type of airplane 1b (4a, 5a and p-t) are by definition unused in all of the display features for the first type of airplane 1a. Further, as described in Table 1 above, out of the parts unique to the first type of airplane 1a, part x is unused in all of the display features, while parts y and z are additionally unused but only in the "animations" feature. Thus, in block 38 of FIG. 3A (or in block 41 of FIG. 3B), parts 4a, 5a, p-t and x are identified as excluded parts for the first type of airplane 1a because those parts are unused in all of the five display features for the first type of airplane 1a. In block 39 of FIG. 3A (or in block 42 of FIG. 3B), the list of excluded parts (4a, 5a, p-t, x) created in this manner is saved for the first type of airplane 1a, as part of a configuration file of the first type of airplane 1a in some embodiments or independently of a configuration file in other embodiments.

Similarly, the list of excluded parts for the second type of airplane 1b is built based on the determination that the following parts are unused in each of five display features defined for the second type of airplane 1b:

TABLE 3

| Display Feature | Unused Part(s) |
| --- | --- |
| "animations" | Parts (4), (5), (x-z), (p), (q), (r) |
| "constraints" | Parts (4), (5), (x-z), (p), (q), (r), (s), (t) |
| display feature (i) | Parts (4), (5), (x-z), (p), (q), (r), (s) |
| display feature (ii) | Parts (4), (5), (x-z), (p), (q), (r), (s), (t) |
| display feature (iii) | Parts (4), (5), (x-z), (p), (q), (r), (s), (t) |

Note that the parts unique to the other (first) type of airplane 1a (4, 5 and x-z) are by definition unused in all of the display features for the second type of airplane 1b. Further, of the parts unique to the second type of airplane 1b, parts p, q, r are unused in all of the display features, while parts s and t are additionally unused but only in the four or three display features out of the total five display features. Thus, in block 38 of FIG. 3A (or in block 41 of FIG. 3B), parts 4, 5, x-z and p-r are identified as excluded parts for the second type of airplane 1b because those parts are unused in all of the five display features for the second type of airplane 1b. Then, in block 39 of FIG. 3A (or in block 42 of FIG. 3B, the list of excluded parts (4, 5, x-z, p-r) created in this manner is saved for the second type of airplane 1b, as part of a configuration file in some embodiments or independently of a configuration file in other embodiments.

Accordingly, as shown in FIG. 2B, the single 3D dataset 30, which is created to represent both of the two types of airplanes 1a and 1b sharing some common parts, includes the geometry dataset 32 including geometry data for the common parts (1, 2, 3, 6, 7, 8), for the parts unique to the first type of airplane 1a (4, 5, x-z), and for the parts unique to the second type of airplane 1b (4a, 5a, p-t). The 3D dataset 30 also includes the list of excluded parts 33 created for the first type of airplane 1a (4a, 5a, p-t, x) and the list of excluded parts 34 created for the second type of airplane 1b (4, 5, x-z, p-r) according to various embodiments of the present invention. These lists of excluded parts may be saved as part of the respective configuration files for the first and second types of airplanes 1a and 1b, or may be saved for the first and second types of airplanes 1a and 1b but independently of their configuration files.

During rendering of each type of airplane 1a or 1b, its excluded parts including those parts that uniquely belong to the other type of airplane are not even loaded to thereby speed up the loading/rendering process, as shown in the flowcharts of FIGS. 4A and 4B described above. As described above, not only the geometry data of the excluded parts but also the metadata of the excluded parts may be excluded from being loaded in some embodiments, while in other embodiments only the geometry data of the excluded parts are excluded from being loaded.

As would be apparent from the foregoing description, application of the list of excluded parts in a 3D dataset to represent multiple types of objects sharing common parts allows for easy maintenance/updating of the common parts, which needs to be performed only once in the single 3D dataset. Also, use of the list of excluded parts for each type of objects sharing common parts as represented in a single 3D dataset allows for easy addition of further types of objects, which also share the same common parts, to the 3D dataset. That is, 3D modeling of the common parts has been completed in the 3D dataset and thus can be reused when adding further types of objects to the 3D dataset.

Figure 5:
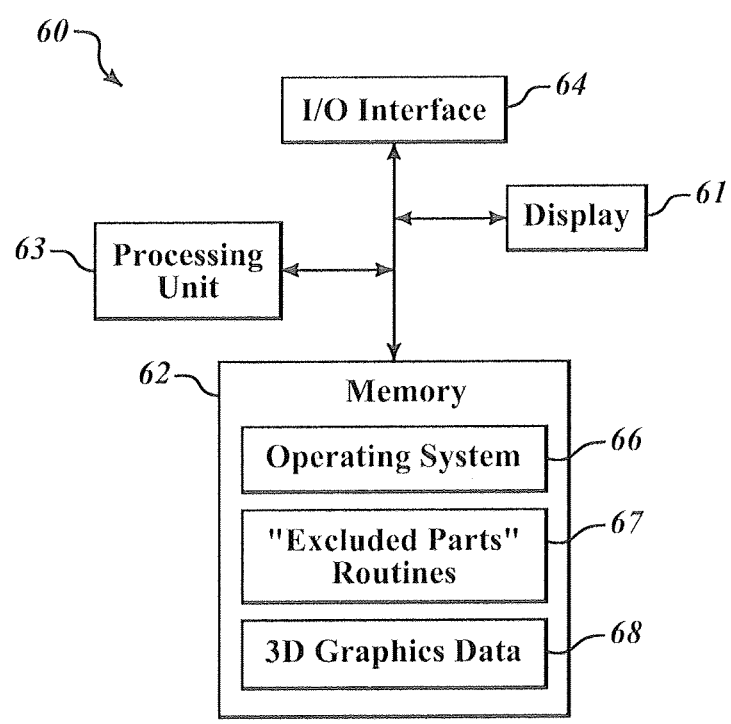
FIG. 5 is a block diagram of several components of a computing device suitable for executing various algorithms such as those of FIGS. 3A-4B, according to exemplary embodiments of the present invention.

FIG. 5 is a block diagram illustrating several of the key components of a computing device 60, which may be used to execute an algorithm for generating an excluded parts list to be saved as shown in FIGS. 3A and 3B, and an algorithm for rendering a 3D graphics object without loading data related to excluded parts as shown in FIGS. 4A and 4B, according to various embodiments of the present invention. Those skilled in the art will appreciate that the computing device 60 may include many more components than those shown in FIG. 5. However, it is not necessary that all of these generally conventional components be shown in order to disclose an enabling embodiment for practicing the invention. As shown in FIG. 5, the computing device 60 includes a display 61, a memory 62, a processing unit 63, and an input/output ("I/O") interface 64, all interconnected via a bus. The display 61 may be a touch sensitive display in some embodiments. The I/O interface 64 is provided for connection to other devices, such as an external storage or a network (not shown), from which 3D datasets (or object files) depicting any 3D graphics object may be loaded onto the computing device 60 (or the memory 62). The I/O interface 64 includes the necessary circuitry for such a connection and is constructed for use with the necessary protocols, as will be appreciated by those skilled in the art.

The memory 62 generally comprises a random access memory ("RAM"), a read-only memory ("ROM"), a permanent mass storage device, such as a hard disc drive, tape drive, floppy disc drive, optical disc drive, magneto-optical disc drive, flash memory drive (e.g., USB flash drive), drum memory, or combination thereof, and a removable memory device that may be coupled to the computing device 60. The memory 62 may also include cache and registers of, or accessible by, the Processing Unit 63. The memory 62 stores an operating system 66 and one or more algorithms/routines 67, such as those depicted in FIGS. 3A, 3B, 4A and 4B, and a database 68 for storing 3D graphics data or 3D datasets (or object files), on which the algorithms/routines 67 may be executed.

Although an exemplary computing device 60 has been described that generally conforms to a conventional computing device, those skilled in the art will appreciate that a computing device 60 may be any of a great number of devices capable of executing a parts exclusion algorithm according to the present invention. In various exemplary embodiments of the present invention, the computing device 60 does not require specialized hardware. Rather, a standard processor is sufficient, as used in a typical desktop or laptop computer or in a mobile device such as a tablet device. Further, a constrained memory, i.e., a limited amount of memory relative to a typical computer graphics rendering system, may be sufficient.

The various embodiments described above can be combined to provide further embodiments. All of the U.S. patents, international patent applications and non-patent publications referred to in this specification are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A computer-implemented system comprising a processor, a memory, and a display, wherein:
   the memory is configured to be loaded with 3D graphics data of an object that consists of multiple parts, wherein the 3D graphics data includes a 3D geometry dataset and a configuration file, and in the configuration file each of the multiple parts is user-specified as used or unused in each of multiple display features; and
   the processor, when loaded with computer-executable instructions, executes an algorithm including:
   (i) determining which of the multiple parts are user-specified as unused in each of the multiple display features;
   (ii) determining those parts that are user-specified as unused in all of the multiple display features as excluded parts, while determining those parts that are user-specified as used in at least one of the multiple display features as non-excluded parts;
   (iii) saving a list of the excluded parts in association with the object; and
   (iv) in rendering the object on the display, loading only 3D geometry data of the non-excluded parts independently of animation key frames that depict the non-excluded parts, while not loading 3D geometry data of the excluded parts, wherein not loading the 3D geometry data of the excluded parts is different from not loading animation key frames in which the excluded parts are not visible.

2. The system according to claim 1, wherein the configuration file defines processing of the 3D geometry dataset, and (iii) includes saving the list of the excluded parts in the configuration file.

3. The system according to claim 1, wherein a part user-specified as used in a display feature is a part user-specified as visible in the display feature, while a part user-specified as unused in a display feature is a part user-specified as not visible in the display feature.

4. The system according to claim 1, wherein a part user-specified as used in a display feature is a part that is user-specified as actionable in the display feature, while a part user-specified as unused in a display feature is a part user-specified as not actionable in the display feature.

5. The system according to claim 1, wherein each of the multiple display features defines a display state in which the object is rendered on the display, or a display relationship according to which the multiple parts of the object are rendered on the display.

6. The system according to claim 5, wherein the multiple display features includes an animation feature, which is a display feature defining a display state, and a constraint feature, which is a display feature defining a display relationship.

7. The system according to claim 1, wherein the algorithm further includes, prior to (i), providing a UI indication on the display that (i)-(iv) will be executed.

8. The system according to claim 1, wherein (iv) further includes not loading metadata of the excluded parts.

9. A computer-implemented method comprising:
   (i) loading, to a memory device, 3D graphics data of an object that consists of multiple parts, wherein the 3D graphics data includes a 3D geometry dataset and a configuration file, and in the configuration file each of the multiple parts is user-specified as used or unused in each of multiple display features;
   (ii) determining which of the multiple parts are user-specified as unused in each of the multiple display features;
   (iii) determining those parts that are user-specified as unused in all of the multiple display features as excluded parts, while determining those parts that are user-specified as used in at least one of the multiple display features as non-excluded parts;

(iv) saving a list of the excluded parts in association with the object; and (v) in rendering the object on a display, loading only 3D geometry data of the non-excluded parts independently of animation key frames that depict the non-excluded parts, while not loading 3D geometry data of the excluded parts, wherein not loading the 3D geometry data of the excluded parts is different from not loading animation key frames in which the excluded parts are not visible.

10. The method according to claim 9, wherein (iv) includes saving the list of the excluded parts in the configuration file.

11. The method according to claim 9, wherein a part user-specified as used in a display feature is a part that is user-specified as visible or actionable in the display feature, while a part user-specified as unused in a display feature is a part user-specified as not visible or not actionable in the display feature.

12. The method according to claim 9, wherein each of the multiple display features defines a display state in which the object is rendered on the display, or a display relationship according to which the multiple parts of the object are rendered on the display.

13. The method according to claim 9, wherein (v) includes not loading metadata of the excluded parts.

14. A non-transitory computer-readable storage medium whose contents configure a computing system to perform a method, the method comprising:
(i) loading, to a memory device, 3D graphics data of first and second objects that share at least one common part, wherein the first object includes at least one first part unique to the first object and the second object includes at least one second part unique to the second object, wherein the 3D graphics data includes a 3D geometry dataset for the first and second objects;
(ii) generating a first list of excluded parts for the first object, by determining which parts are user-specified as unused in each of multiple display features for the first object and by identifying those parts that are user-specified as unused in all of the multiple display features for the first object as first excluded parts;
(iii) generating a second list of excluded parts for the second object, by determining which parts are user-specified as unused in each of multiple display features for the second object and by identifying those parts that are user-specified as unused in all of the multiple display features for the second object as second excluded parts;
(iv) in rendering the first object on a display, loading only 3D geometry data of non-excluded parts of the first object independently of animation key frames that depict the non-excluded parts of the first object, while not loading 3D geometry data of the first excluded parts, wherein not loading the 3D geometry data of the first excluded parts is different from not loading animation key frames in which the first excluded parts are not visible; and
(v) in rendering the second object on the display, loading only 3D geometry data of non-excluded parts of the second object independently of animation key frames that depict the non-excluded parts of the second object, while not loading 3D geometry data of the second excluded parts, wherein not loading the 3D geometry data of the second excluded parts is different from not loading animation key frames in which the second excluded parts are not visible.

15. The medium according to claim 14, wherein (iv) includes loading only metadata of the non-excluded parts of the first object while not loading metadata of the first excluded parts, and (v) includes loading only metadata of the non-excluded parts of the second object while not loading metadata of the second excluded parts.

16. The medium according to claim 14, wherein (ii) includes saving the list of the first excluded parts as part of, or in connection with, a first configuration file for the first object, and (iii) includes saving the list of the second excluded parts as part of, or in connection with, a second configuration file for the second object.

17. The medium according to claim 14, wherein the first excluded parts include those parts unique to the first object but are user-specified as unused in all of the multiple display features for the first object and those parts unique to the second object, while the second excluded parts include those parts unique to the second object but are user-specified as unused in all of the multiple display features for the second object and those parts unique to the first object.

18. The medium according to claim 14, wherein a part user-specified as used in a display feature is a part that is user-specified as visible or actionable in the display feature, while a part user-specified as unused in a display feature is a part user-specified as not visible or not actionable in the display feature.

* * * * *